United States Patent [19]

Ahne et al.

[11] 4,371,685

[45] Feb. 1, 1983

[54] RADIATION-REACTIVE PRECURSOR STAGES OF HIGHLY HEAT-RESISTANT POLYMERS

[75] Inventors: Hellmut Ahne, Röttenbach; Eberhard Kühn, Hemhofen; Roland Rubner, Röttenbach, all of Fed. Rep. of Germany

[73] Assignee: Siemens Aktiengesellschaft, Munich, Fed. Rep. of Germany

[21] Appl. No.: 270,637

[22] Filed: Jun. 4, 1981

[30] Foreign Application Priority Data

Jun. 10, 1980 [DE]  Fed. Rep. of Germany ....... 3021748

[51] Int. Cl.³ .............................................. G03C 1/68
[52] U.S. Cl. ..................................... 528/73; 430/270; 430/280; 430/281; 430/296; 430/300; 430/311; 204/159.15; 204/159.18; 528/287; 528/289; 528/291; 528/337; 528/341
[58] Field of Search .............. 430/270, 280, 281, 17, 430/296, 300, 302, 311, 323; 204/159.15, 159.19; 528/73, 287, 289, 291, 337, 341

[56] References Cited

U.S. PATENT DOCUMENTS 3,957,512  5/1976  Kleeberg et al. .................. 430/283
3,964,908  6/1976  Bargon et al. ..................... 430/270
4,121,936  10/1978  Matsuda et al. .................. 430/270

*Primary Examiner*—Jack P. Brammer
*Attorney, Agent, or Firm*—Kenyon & Kenyon

[57] ABSTRACT

The invention relates to oligomeric and/or polymeric radiation-reactive precursor stages of polymers on the basis of heterocycles and has the objective to make available radiation-reactive precursor stages of this kind in which the problems arising due to the need of using organic solvents are eliminated. For this purpose, the invention provides addition products of cyclic carboxylic-acid anhydrides with hydroxyl group-containing compounds, where the hydroxyl group-containing compounds represent addition products of olefinically unsaturated monoepoxides on carboxyl group-containing prepolymers of polyimides, polyisoindoloquinazoline diones, polyoxazine diones and polyquinazoline diones or on amino group-containing prepolymers of polyimidazoles and polyimidazopyrrolones or on hydroxyl group-containing prepolymers of polyoxazoles. The radiation-reactive precursor stages according to the invention are suited, for example, for the manufacture of highly heat-resistant relief structues.

17 Claims, No Drawings

RADIATION-REACTIVE PRECURSOR STAGES OF HIGHLY HEAT-RESISTANT POLYMERS

BACKGROUND OF THE INVENTION

The present invention relates to oligomeric and/or polymeric, radiation-reactive precursor stages on the basis of heterocycles.

Precursor stages of polymers on the basis of heterocycles are known, for example, from German Pat. No. 2 308 830 and its corresponding U.S. Pat. No. 3,957,512. These polymer precursor stages are polyaddition or polycondensation products of polyfunctional carbocyclic or heterocylic compounds, carrying radiation-sensitive radicals, with diamines, diisocyanates, bis-acid chlorides or dicarboxylic acids. The compounds, carrying radiation-sensitive radicals, contain two carboxyl, carboxylic-acid chloride, amino, isocyanate or hydroxyl groups suitable for addition or condensation reactions and in part, in ortho- or peri-position thereto, radiation-reactive groups bound to carboxyl groups in ester-fashion. The diamines, diisocyanates, bis-acid chlorides and dicarboxylic acids to be reacted with these compounds have at least one cyclic structure element.

The known polymer precursor stages serve to prepare protective and insulating layers as well as relief structures of highly heat-resistant polymers, into which they are converted by light exposure and, optionally, subsequent annealing. In the process, particularly polymers of the following classes of substances are obtained: Polyimides (including polyamidimides and polyester imides), poly-1,3-quinazoline-2,6-diones, polyisoindoloquinazoline diones, poly-1,3-oxazine-6-ones and polybenz-1,3-oxazine-2,4-diones.

The known polymer precursor stages, which can be cross-linked by radiation and can, therefore, be structured by photo-techniques, are soluble in organic solvents. If organic solvents are used, however, problems arise, particularly with respect to toxicity, flammability and swelling and the destruction of sealing materials as well as disposal problems.

SUMMARY OF THE INVENTION

It is an object of the present invention to make available radiation-reactive precursor stages of the type mentioned at the outset, with which the problems connected with the use of organic solvents are eliminated.

According to the present invention, this and other objects are achieved by the provision that the precursor stages consist of addition products of cyclic carboxylic-acid anhydrides with hydroxyl group-containing compounds, where the hydroxyl group-containing compounds are addition products of olefinically unsaturated mono-epoxides on carboxyl group-containing polyaddition products of aromatic and/or heterocyclic tetracarboxylic-acid dianhydrides and diamino compounds or diamino compounds with at least one ortho-position amido group or on carboxyl group-containing polyaddition products of aromatic and/or heterocyclic dihydroxydicarboxylic acids or corresponding diaminodicarboxylic acids and diisocyanates; or on amino group-containing polycondensation products of aromatic and/or heterocyclic tetraamino compounds with dicarboxylic-acid chlorides or esters, or on amino group-containing polyaddition products of the tetraamino compounds and tetracarboxylic-acid dianhydrides or on hydroxyl group-containing polycondensation products of aromatic and/or heterocyclic dihydroxydiamino compounds with dicarboxylic-acid chlorides or esters.

The radiation-reactive precursor stages of highly heat-resistant polymers according to the present invention have the essential property that they are highly soluble in aqueous alkaline solvents. This property is of importance particularly for the resist technology since here, not only working in or out of an aqueous solution is possible, but the problems which arise when organic solvents are used are also eliminated. Through the invention, reactive precursor stages of highly heat-resistant polymers with negative-resist properties are made available for the first time, which can be developed, like positive resists, in aqueous alkaline solution and can, therefore, be structured photo-technically without the use of organic solvents. Through the use of the polymer precursor stages according to the present invention, which can, incidentally, be prepared in a simple manner, advantages are therefore obtained with respect to economy and ecology.

The polymer precursor stages according to the present invention are particularly well suited for the preparation of structured, highly heat-resistant protection and insulating layers in microelectronics (generation of fine structures) as well as for use as photo-resists (see in this connection the concurrently filed U.S. Patent Application "Method For The Preparation Of Highly Heat-Resistant Relief Structures And The Use Thereof", Ser. No. 270,357.

The radiation-reactive precursor stages according to the invention have generally the following structure:

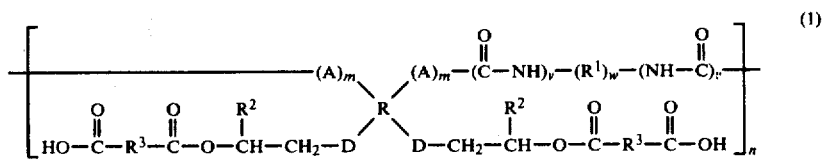

or

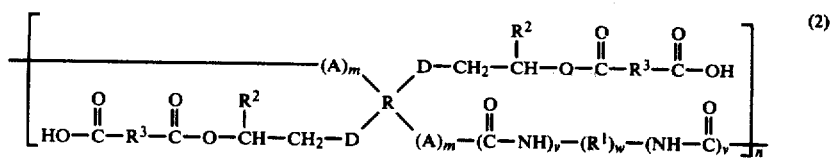

In Formulas (1) and (2), n is an integral number from 2 to about 100; m, v and w are 0 or 1. The following applies to R, R¹, R², R³, A and D:

- R is an optionally halogenated, at least partially aromatic and/or heterocyclic, tetravalent, i.e., tetrafunctional radical, in which two valences respectively are arranged in adjacent positions; if the radical R has several aromatic and/or heterocyclic structure elements, then the pairs of valences are situated at respective end-position structure elements of this type;
- R¹ is an optionally halogenated divalent, i.e., difunctional radical of aliphatic and/or cycloaliphatic structure, optionally having heteroatoms, and/or aromatic and/or heterocyclic structure;
- R² is an olefinically unsaturated radical, for example, an allyl ether-containing or a maleinimide-containing group and in particular, an optionally substituted, (meth)acrylester-containing group;
- R³ is an optionally halogenated, divalent, i.e., difunctional radical of aliphatic and/or cycloaliphatic, olefinically unsaturated and/or aromatic and/or heterocyclic structure;
- A is —O—, —NH— or

and D is

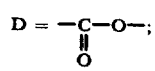

—O—, —S—, —NH— or

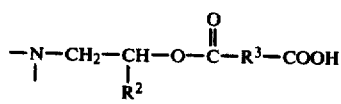

The following also applies to these structures:
For m=1 and v=1, A=—NH— or —O— and

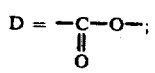

For m=0 and v=1, $$D = -\overset{O}{\underset{\|}{C}}-O-;$$

For m=1 and v=0,

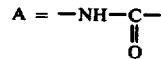

and D=—O—, —S— —NH— or

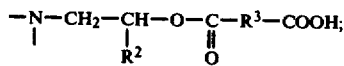

For m=0 and w=0, v=1.

The radicals R, R¹, R² and R³ have, in particular, the following meaning:

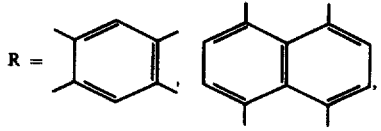

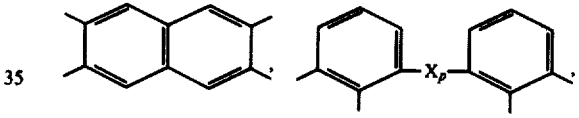

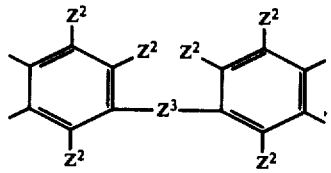

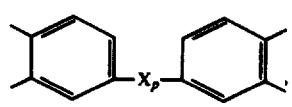

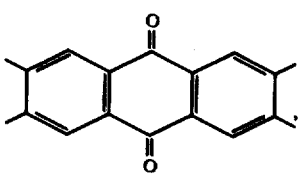

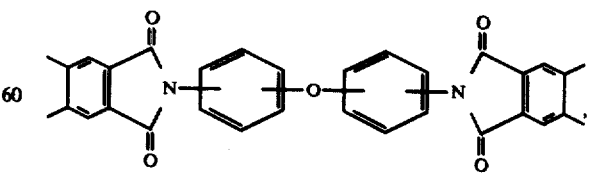

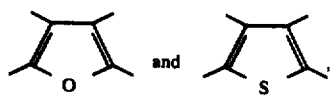

where p=0 or 1 and X stands for one of the following radicals:
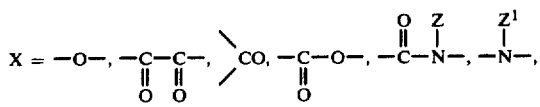
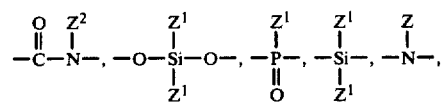
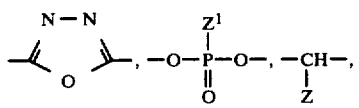
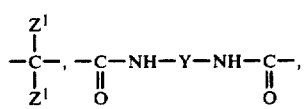
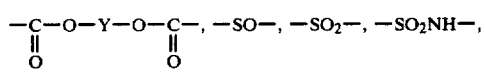
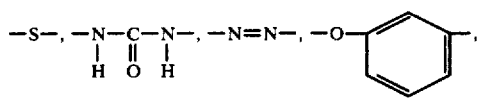
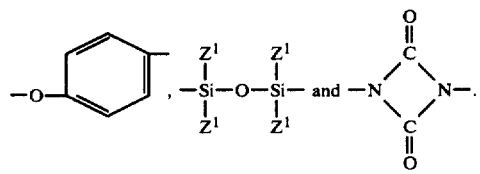
For the further radicals applies:
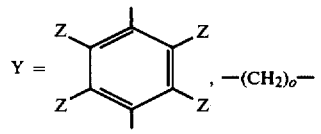
with o=2 to 10 and
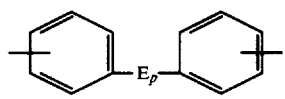
with p=0 or 1
Z=H or alkyl with 1 to 6 carbon atoms,
$Z^1$=alkyl with 1 to 10 carbon atoms or aryl,
$Z^2$=aryl or heteroaryl and
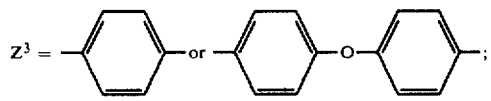
-continued
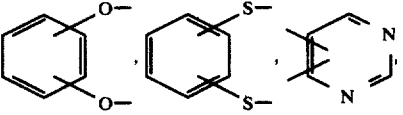
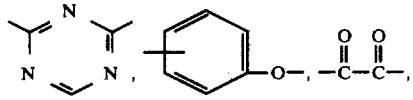
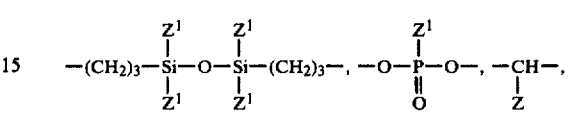
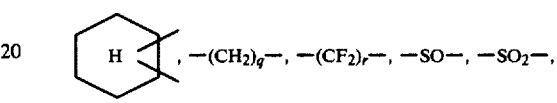
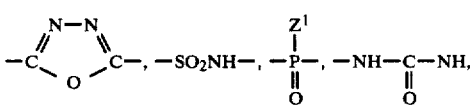
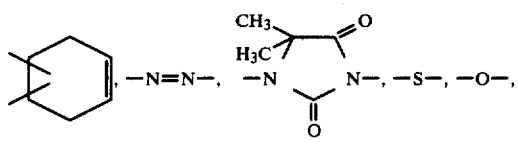
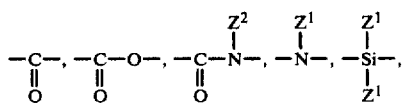
where q=2 to 14 and r=2 to 18, and $Z^1$ and $Z^2$ are defined as above.
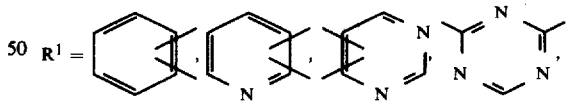
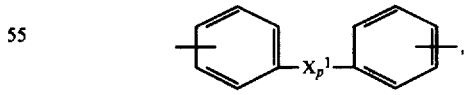
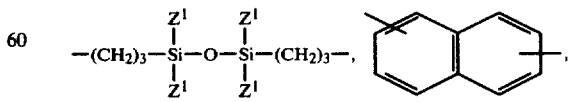
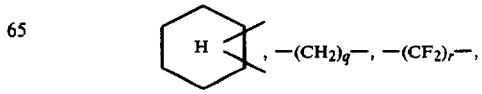

where p=0 or 1, q=2 to 14 and r=2 to 18, and $Z^1$ is defined as above;

$X^1 =$ —O—, —C(=O)—C(=O)—, >CO, —C(=O)—O—, —C(=O)—N($Z^2$)—, —N($Z^1$)—,

—Si($Z^1$)($Z^1$)—, —O—Si($Z^1$)($Z^1$)—O—, —P(=O)($Z^1$)—, —N(Z)—, pyrazole ring, —O—P(=O)(O—)—O—, —CH(Z)—, —C($Z^1$)($Z^1$)—, —Si($Z^1$)($Z^1$)—O—Si($Z^1$)($Z^1$)—,

—N(—C(=O)—)(—C(=O)—)N—, —SO—, —SO$_2$—, —SO$_2$NH—, —S—,

—N(H)—C(OH)—N(H)—, —N=N—, —O—phenyl—, wherein Z, $Z^1$ and $Z^2$ are defined as above.

$R^2 = -X^2-O-\underset{O}{\underset{\|}{C}}-\underset{Y^2}{\underset{|}{C}}=CH_2$, $-X^2-O-(CH_2)_s-NH$—triazine—$O-C(=O)-C(Y^2)=CH_2$, with $O-C(=O)-C(Y^2)=CH_2$, $-X^2-O-CH_2-CH=CH_2$, $-X^2-O-(CH_2)_s-NH$—triazine—$O-CH_2-CH=CH_2$ and $O-CH_2-CH=CH_2$;

$-X^2$—(phenyl with $Y^2$)—N(maleimide), where s=2 to 16;

$X^2=$ —CH$_2$— and —CH$_2$—O—(CH$_2$)$_r$—O]$_t$—(CH$_2$)$_3$—; and $Y^2=$ —H, —CH$_3$, —Cl, —Br or —C≡N, where r=2 to 18, s=2 to 16 and t=1 to 10.

$R^3 =$ —(CH$_2$)$_s$—, —CY$^2$=CY$^2$—, —(xylyl)—, —CH$_2$—C(=CH$_2$)—,

—CH$_2$—CH(C$_{12}$H$_{23}$)— and —(trimethylcyclohexyl)—;

where s=2 to 16 and $Y^2$ is defined as above.

The radiation-reactive precursor stages according to the present invention are addition products of cyclic carboxylic-acid anhydrides with hydroxyl group-containing compounds. The hydroxyl group-containing compounds, in turn, are addition products of olefinically unsaturated monoepoxides on carboxyl group-containing or amino group-containing or hydroxyl group-containing prepolymers. These hydroxyl group-containing compounds, which are precursor stages of polyimides, polyisoindoloquinazoline diones, polyoxazine diones, polyquinazoline diones, polyimidazoles, polyimidazopyrrolones and polyoxazoles, are the subject of commonly-assigned U.S. Patent Applications Ser. No. 179,453, Ser. No. 179,455 and Ser. No. 179,462, all filed on Aug. 19, 1980.

To the mentioned hydroxyl group-containing compounds, cyclic carboxylic-acid anhydrides are added. These anhydrides have the following structure (3), where the radical $R^3$ has the meaning given above:

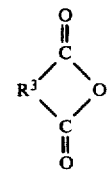
(3)

Preferred here are maleic-acid anhydride and itaconic-acid anhydride. Further anhydrides are, for example, succinic-acid anhydride and phthalic-acid anhydride.

The structure of the radiation-reactive precursor stages according to the invention are illustrated with the aid of the following formulas (4) to (10):

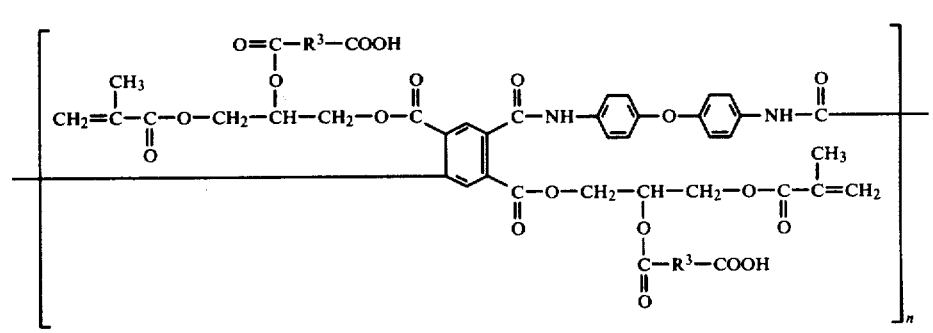
(4)

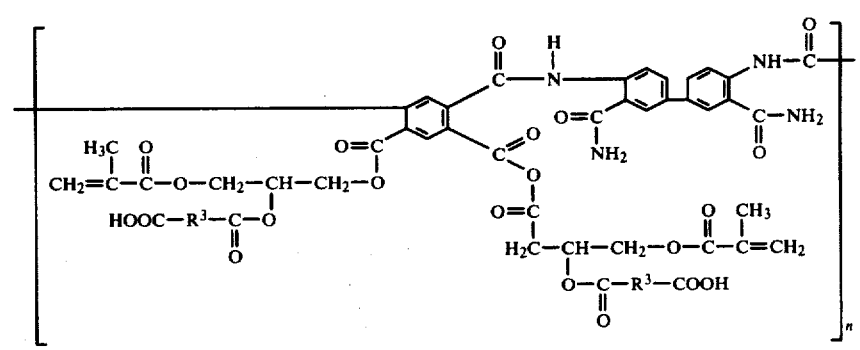
(5)

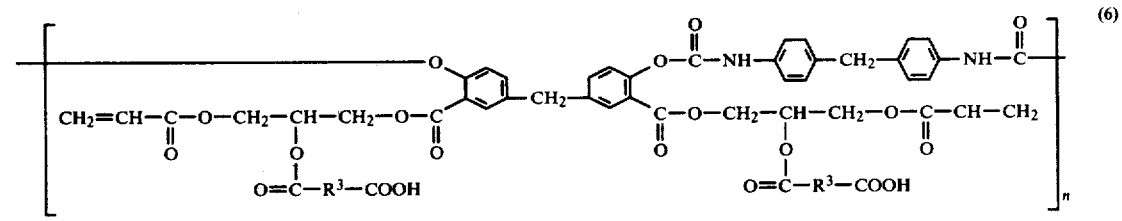
(6)

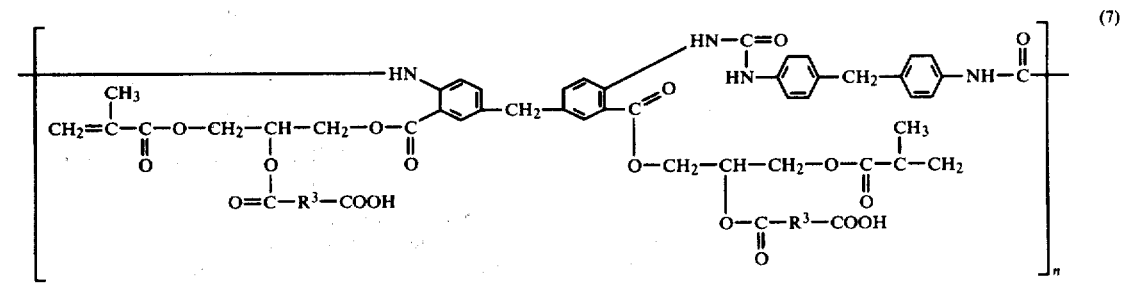
(7)

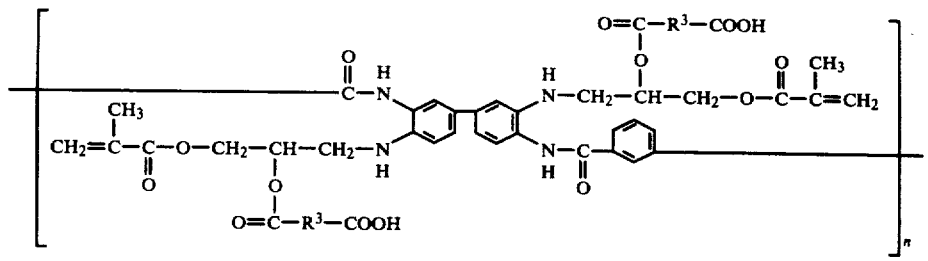

(8)

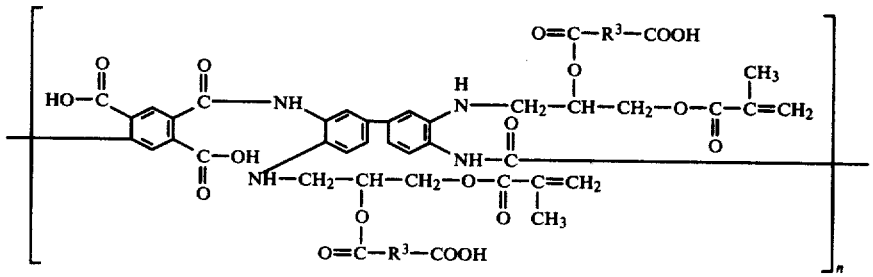

(9)

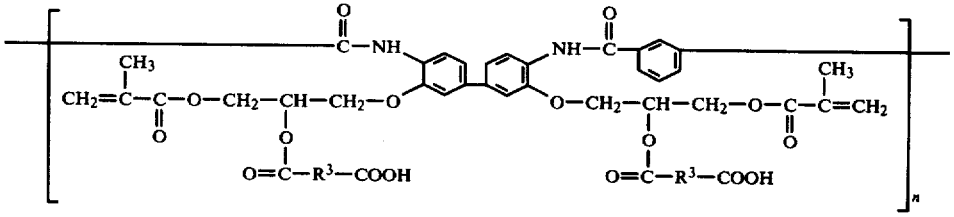

(10)

In formulas (4) to (10), the following radiation-reactive polymer precursor stages are shown:

(4) addition product of a carboxylic-acid anhydride and a polyimide precursor stage, obtained by addition of glycidylmethacrylate on the polyaddition product of pyromellithic-acid anhydride and 4,4'-diaminodiphenyl ether;

(5) addition product of a carboxylic-acid anhydride and a polyisoindoloquinazoline dione precursor stage, obtained by addition of glycidylmethacrylate on the polyaddition product of pyromellithic-acid anhydride and 4,4'-diaminodiphenyl-3,3'-dicarboxylic-acid amide;

(6) addition product of a carboxylic-acid anhydride and a polyoxazine dione precursor stage, and specifically a polybenzoxazine dione precursor stage, obtained by addition of glycidylacrylate on the polyaddition product of 4,4'-dihydroxydiphenylmethane-3,3'-dicarboxylic acid and 4,4'-diphenylmethanediisocyanate;

(7) addition product of a carboxylic-acid anhydride and a polyquinazoline dione precursor stage, obtained by addition of glycidylmethacrylate on the polyaddition product of 4,4'-diaminodiphenylmethane-3,3'-dicarboxylic acid and 4,4'-diphenylmethanediisocyanate;

(8) addition product of a carboxylic-acid anhydride and a polyimidazole precursor stage, and specifically a polybenzimidazole precursor stage, obtained by addition of glycidylmethacrylate on the polycondensation product of 3,3'-diaminobenzidine and isophthalic-acid dimethyl ester;

(9) addition product of a carboxylic-acid anhydride and a polyimidazopyrrolone precursor stage, obtained by addition of glycidylmethacrylate on the polyaddition product of 3,3'-diaminobenzidine and pyromellithic-acid dianhydride;

(10) addition product of a carboxylic-acid anhydride and a polyoxazole precursor stage, and specifically a polybenzoxazole precursor stage, obtained by addition of glycidylmethacrylate on the polycondensation product of 3,3'-dihydroxybenzidine and isophthalic-acid dichloride.

The term "polyimides", incidentally, also includes compounds such as polyester imides, polyamidimides and polyquinazolinedionimides. "Diamino compounds" are understood to include also derivatives of hydrazine; in the reaction of such compounds with tetracarboxylic-acid dianhydrides, so-called polyhydrazines are produced.

In addition to being used as photoresists and for the manufacture of protection and insulating layers, where structuring takes place, the precursor stages according to the present invention can also serve generally, in non-structured form, for manufacturing protective and insulating coatings. To particular advantage, these precursor stages can be used for preparing plastic coatings for light-conducting fibers of optical waveguides.

DETAILED DESCRIPTION OF THE INVENTION

The invention is explained in still further detail with reference to the following embodiment examples:

EXAMPLE 1

Preparation Of A Radiation-Reactive Precursor Stage For Polybenzoxazole

To a solution of 6.49 parts by weight 3,3'-dihydroxybenzidine in 50 parts by volume dimethylacetamide and 9 parts by volume pyridine, 6.1 parts by weight isophthalic-acid dichloride in 20 parts by volume cyclohexanone are added dropwise, while stirring intensively, at a temperature of −5° to −20° C. within about 30 minutes. After continued stirring at room temperature for 3 hours, the viscous reaction solution is allowed to stand overnight; the solution then is added dropwise to 1000 parts by volume water, while stirring. The resin precipitated thereby is separated, washed with water and methanol and dried in a vacuum at about 60° C.

10 parts by weight of the polybenzoxazole prepolymer prepared in the manner described are dissolved in 100 parts by volume N-methylpyrrolidone. To this solution are added 50 parts by volume glycidylmethacrylate, 0.5 parts by volume benzyldimethylamine and 0.5 parts by weight hydroquinone. After heating for 2 hours to a temperature of about 90° C., the reaction product is precipitated, while stirring, from 1000 parts by volume ethanol and is dried in a vacuum to yield a yellow-brown powder.

3.2 parts by weight of the addition product obtained, which is no longer soluble in an aqueous alkaline solution, are dissolved in 35 parts by volume N-methylpyrrolidone. While stirring, 1 part by weight itaconic-acid anhydride is added to this solution. After a reaction time of 20 hours at room temperature, heat is applied for 3 hours at 50° to 60° C. The reaction solution then is added dropwise to 500 parts by volume water, while stirring vigorously. The precipitate collected is drawn off and dried at room temperature in a vacuum. The resin obtained is soluble in 0.7% sodium hydroxide solution. The IR spectrum shows a wide band at 3100 to 3400 cm$^{-1}$, which can be related to the carboxyl group.

EXAMPLE 2

Preparation Of A Radiation-Reactive Precursor Stage For Polybenzimidazole 10.7 parts by weight 3,3'-diaminobenzidine are dissolved in 95 parts by volume N-methylpyrrolidone and heated, together with 9.7 parts by weight isophthalic-acid dimethyl ester, for 8 hours to a temperature of 150° to 175° C. and subsequently for 2 days to approximately 185° C. To this solution are then added 40 parts by volume glycidylmethacrylate. After a reaction time of 48 hours at room temperature and 4 hours at about 50° to 60° C., 8 parts by weight itaconic-acid anhydride are added to the reaction mixture. After a reaction time of 4 days at room temperature, the reaction product is precipitated with 1000 parts by volume water and dried in a vacuum. The resin obtained is soluble in an aqueous alkaline solution and exhibits a broad absorption in the IR spectrum between 3100 and 3400 cm$^{-1}$ which can be related to the COOH group.

EXAMPLE 3

Preparation Of A Radiation-Reactive Precursor Stage For Polyimide

To 65.4 parts by weight pyromellithic-acid dianhydride (0.3 mol) in 450 parts by volume dimethylacetamide are added, while stirring, 45 parts by weight 4,4'-diaminodiphenyl ether (0.23 mol) and subsequently, the solution is stirred for 2 hours at room temperature. Then, 2 parts by weight methacrylic acid-2-hydroxyethyl ester (0.016 mol) are added to the reaction mixture in order to bind the still present end-position anhydride groups. After stirring at room temperature for 2 hours, 150 parts by volume glycidylmethacrylate, 1.5 parts by volume benzyldimethylamine and 0.1 parts by weight hydroquinone are added to the reaction solution. Subsequently, the solution is warmed to a temperature of 50° to 60° C. while stirring for 23 hours and then is added dropwise to 4000 parts by volume ethanol while stirring vigorously. The precipitate formed is drawn off and is dried in a vacuum at room temperature. The reaction product is no longer soluble in an aqueous alkaline solution but can be dissolved in polar organic solvents. In the IR spectrum, the polyimide precursor stage shows an ester band at 5.8 μm.

35 parts by weight of the polyimide precursor stage obtained are dissolved in 100 parts by volume dimethylacetamide, and 10 parts by weight maleic acid anhydride are added thereto. After a reaction time of 5 days at room temperature, the resin solution is diluted with 50 parts by volume dimethylacetamide and precipitated from 2500 parts by volume water. The resin is washed with water and is dried in a vacuum. The yellowish powder obtained is soluble in an aqueous alkaline solution. The IR spectrum shows the COOH absorption band at 3100 to 3400 cm$^{-1}$.

EXAMPLE 4 Preparation Of A Radiation-Reactive Precursor Stage For Polyamidimide 50 parts by weight of a polyamidimide prepolymer prepared from 2,6-diaminopyridine and trimellithic-acid anhydride are dissolved in 100 parts by volume dimethylacetamide and reacted, while stirring, with 0.05 parts by volume benzyldimethylamine, 0.05 parts by weight hydroquinone and 75 parts by volume glycidylmethacrylate. The solution is warmed for 19 hours to a temperature of 50° to 60° C. and subsequently, 10 parts by weight phthalic-acid anhydride are added. After a reaction time of 6 days at room temperature, the resin is precipitated from 2000 volume parts water and is dried. The so obtained light-brown powder is soluble in an aqueous alkaline solution.

EXAMPLE 5

Preparation Of A Radiation-Reactive Precursor Stage For Polyisoindoloquinazolinedione 11 parts by weight 4,4'-diaminodiphenyl-3,3'-dicarboxylic acid amide are made into a suspension with 120 parts by volume dimethylacetamide and are reacted, while stirring, with 10 parts by weight pyromellithic acid dianhydride, dissolved in 100 parts by volume of a dimethylacetamide/dimethylformamide mixture (volume ratio 1:1). After stirring for 2 hours, 25 parts by volume glycidylmethacrylate, 0.5 parts by volume benzyldimethylamine and 0.05 parts by weight hydroquinonemonoethyl ether are added to the solution obtained. After stirring for 25 hours at a temperature of 60° C., a resin is precipitated from the solution with 3000 parts by volume propanol, and is dried. This resin is no longer soluble in aqueous alkaline solutions and shows an ester band in the IR spectrum at 5.8 μm.

10 parts by weight of the resin are dissolved in 100 parts by volume dimethylacetamide and reacted with 5 parts by weight maleic acid anhydride. After letting the solution stand for 5 days at about 30° C., the reaction solution is added dropwise to 1000 parts by volume water and the precipitated resin is dried, a light-brown powder being obtained which is soluble in an aqueous alkaline solution.

EXAMPLE 6

Preparation Of A Radiation-Reactive Precursor Stage For Polyquinazolinedionimide From 22 parts by weight pyromellithic acid dianhydride, dissolved in 200 volume parts dimethylacetamide, and 27 parts by weight 3-(p-aminophenyl)-7-amino-2,4-(1H, 3H)-quinazoline dione, dissolved in 150 volume parts dimethylacetamide, a polyquinazolinedionimide prepolymer is obtained after a reaction time of 2 hours at room temperature while stirring.

To the solution of this prepolymer in dimethylacetamide, 2 parts by volume acrylic-acid-2-hydroxyethyl ester are added. After stirring for 1 hour, the reaction solution is reacted with 50 volume parts glycidyl acrylate, 0.5 parts by volume benzyldimethylamine and 0.05 parts by weight hydroquinone. After heating to a temperature of about 60° C. for 20 hours, 10 parts by weight succinic acid anhydride are added to the solution. After a reaction time of 4 days at room temperature, a slightly brownish resin which is soluble in an aqueous alkaline solution is obtained by precipitation in 2000 volume parts water.

EXAMPLE 7

Preparation Of A Radiation-Reactive Precursor Stage For Polybenzoxazine Dione

To a solution of 28.8 parts by weight methylenedisalicylic acid (0.1 mol) and 0.1 parts by weight 1,4-diazabicyclo(2,2,2)octane (as catalyst) in 100 volume parts N-methylpyrrolidone, 25 parts by weight p,p'-diphenylmethane diisocyanate (0.1 mol), dissolved in 50 volume parts N-methylpyrrolidone, are slowly added dropwise while stirring. After a reaction time of 20 hours at room temperature, 75 parts by volume glycidyl acrylate and 0.1 parts by weight hydroquinone are added to this solution while stirring. After a further reaction time of 20 hours at a temperature of 50° to 60° C. and 48 hours at room temperature, the resin is precipitated with 2000 volume parts toluene and is dried in a vacuum.

5 parts by weight of the dried resin are dissolved in 20 volume parts of a dimethylacetamide/dioxane mixture (volume ratio 1:1) and are reacted with 1 part by weight maleic acid anhydride. After standing at room temperature for 6 days, a resin soluble in an aqueous alkaline solution is obtained by precipitation in 50 volume parts water.

EXAMPLE 8

Preparation Of A Radiation-Reactive Precursor Stage For Polyquinazoline Dione 1.4 parts by weight 4,4'-diphenylmethane diisocyanate are dissolved at about 100° C. in 110 parts by weight polyphosphoric acid and then heated to about 140° C. To the so obtained solution, 1.36 parts by weight 4,4'-diaminodiphenylmethane-3,3'-dicarboxylic acid are added under nitrogen. The reaction mixture is stirred vigorously for 5 hours at a temperature of 150° to 155° C.; after the mixture has cooled down, precipitation with 1000 volume parts water follows and the yellow-brown product obtained (2.7 parts by weight) is dried. The non-radiation-reactive prepolymer, a polyureic acid, shows an absorption at 1670 cm$^{-1}$ in the IR spectrum which is typical of the urea grouping. On the other hand, no quinazoline dione bands appear which would have to be located at 1730 cm$^{-1}$, i.e, no partial cyclization has yet taken place.

2.7 parts by weight of the polyureic acid obtained in the manner described are dissolved in 50 volume parts N-methylpyrrolidone, reacted with 0.5 volume parts benzyldimethylamine, 0.5 parts by weight hydroquinone and 20 volume parts glycidylmethacrylate while stirring, and warmed for 20 hours to a temperature of about 60° C. Thereupon, 1 part by weight maleic acid anhydride is added and, after a reaction time of 7 days at room temperature, the solution is precipitated from 50 volume parts water. The separated resin is practically colorless and is soluble in 1% aqueous sodium hydroxide solution.

What is claimed is:

1. A radiation-reactive oligomeric and/or polymeric compound which is a precursor of a heterocyclic-based polymer and which is capable of being converted by radiation to said heterocyclic-based polymer, said oligomeric and/or polymeric compound consisting of the addition product of (a) a cyclic carboxylic acid anhydride and (b) a hydroxyl group-containing compound, said hydroxyl group-containing compound itself being an oligomeric and/or polymeric radiation-reactive precursor and consisting of an addition product of (a) an olefinically unsaturated monoepoxide and (b) a member selected from the group consisting of:

(1) a carboxyl group-containing polyaddition product of (i) an aromatic and/or heterocyclic tetracarboxylic acid dianhydride and (ii) a diamino compound or a diamino compound with at least one ortho-position amido group;

(2) a carboxyl group-containing polyaddition product of (i) a member selected from an aromatic and/or heterocyclic dihydroxydicarboxylic acid or an aromatic and/or heterocyclic diaminodicarboxylic acid and (ii) a diisocyanate;

(3) an amino group-containing polycondensation product of (i) an aromatic and/or heterocyclic tetraamino compound and (ii) a dicarboxylic acid chloride ester;

(4) an amino group-containing polyaddition product of (i) an aromatic and/or heterocyclic tetraamino compound and (ii) a tetracarboxylic acid dianhydride; and (5) a hydroxyl group-containing polycondensation product of (i) an aromatic and/or heterocyclic dihydroxydiamino compound and (ii) a dicarboxylic acid chloride or ester.

2. The radiation-reactive precursor according to claim 1 wherein the cyclic carboxylic-acid anhydride is selected from maleic acid anhydride and itaconic-acid anhydride.

3. The radiation-reactive precursor according to claim 1 wherein the hydroxyl group-containing compound is a polyimide precursor.

4. The radiation-reactive precursor according to claim 3 wherein the polyimide precursor is an addition product of glycidylmethacrylate on the polyaddition product of pyromellithic-acid dianhydride and 4,4'-diaminodiphenyl ether.

5. The radiation-reactive precursor according to claim 3 wherein the polyimide precursor is an addition product of glycidyl acrylate on the polyaddition product of benzophenone tetracarboxylic-acid dianhydride and 4,4'-diaminodiphenyl ether.

6. The radiation-reactive precursor according to claim 1 wherein the hydroxyl group-containing compound is a polyisoindoloquinazoline dione precursor.

7. The radiation-reactive precursor according to claim 6 wherein the polyisoindoloquinazoline dione precursor is an addition product of glycidylmethacrylate on the polyaddition product of pyromellithic-acid dianhydride and 4,4'-diaminodiphenyl-3,3'-dicarboxylic-acid amide.

8. The radiation-reactive precursor according to claim 1 wherein the hydroxyl group-containing compound is a polyoxazine dione precursor.

9. The radiation-reactive precursor according to claim 8 wherein the polyoxazine dione precursor is an addition product of glycidylacrylate on the polyaddition product of 4,4'-dihydroxydiphenylmethane-3,3'-dicarboxylic acid and 4,4'-diphenylmethane diisocyanate.

10. The radiation-reactive precursor according to claim 1 wherein the hydroxyl group-containing compound is a polyquinazoline dione precursor.

11. The radiation-reactive precursor according to claim 10 wherein the polyquinazoline dione precursor is an addition product of glycidylmethacrylate on the polyaddition product of 4,4'-diaminodiphenylmethane-3,3'-dicarboxylic acid and 4,4'-diphenylmethane diisocyanate.

12. The radiation-reactive precursor according to claim 1 wherein the hydroxyl group-containing compound is a polyimidazole precursor.

13. The radiation-reactive precursor according to claim 12 wherein the polyimidazole precursor is an addition product of glycidylmethacrylate on the polycondensation product of 3,3'-diaminobenzidine and isophthalic-acid dichloride or isophthalic-acid dimethyl ester.

14. The radiation-reactive precursor according to claim 1 wherein the hydroxyl group-containing compound is a polyimidazo pyrrolone precursor.

15. The radiation-reactive precursor according to claim 14 wherein the polyimidazopyrrolone precursor is an addition product of glycidylmethacrylate on the polyaddition product of 3,3'-diaminobenzidine and pyromellithic-acid dianhydride.

16. The radiation-reactive precursor according to claim 1 wherein the hydroxyl group-containing compound is a polyoxazole precursor.

17. The radiation-reactive precursor according to claim 16 wherein the polyoxazole precursor is an addition product of glycidylmethacrylate on the polycondensation product of 3,3'-dihydroxybenzidine and isophthalic-acid dichloride or isophthalic-acid dimethyl ester.

* * * * *